US009476617B2

(12) United States Patent
Renze et al.

(10) Patent No.: US 9,476,617 B2
(45) Date of Patent: Oct. 25, 2016

(54) THERMOELECTRIC MODULES FOR AN EXHAUST SYSTEM

(75) Inventors: Peter Renze, Mannheim (DE); Jürgen Moors, Neustadt (DE); Georg Degen, Lorsch (DE); Knut Wassermann, Princeton, NJ (US)

(73) Assignee: BASF SE, Ludwigshafen (DE)

( * ) Notice: Subject to any disclaimer, the term of this patent is extended or adjusted under 35 U.S.C. 154(b) by 1251 days.

(21) Appl. No.: 13/251,647

(22) Filed: Oct. 3, 2011

(65) Prior Publication Data

US 2012/0125015 A1 May 24, 2012

Related U.S. Application Data

(60) Provisional application No. 61/411,931, filed on Nov. 10, 2010, provisional application No. 61/389,287, filed on Oct. 4, 2010.

(51) Int. Cl.
*H01L 35/30* (2006.01)
*F25B 21/02* (2006.01)
*F01N 5/02* (2006.01)
*F01N 3/04* (2006.01)
(Continued)

(52) U.S. Cl.
CPC .............. *F25B 21/02* (2013.01); *F01N 5/025* (2013.01); *H01L 35/30* (2013.01); *F01N 3/043* (2013.01); *F01N 13/16* (2013.01); *F01N 2330/14* (2013.01); *F01N 2510/06* (2013.01); *F28F 7/02* (2013.01); *F28F 2255/18* (2013.01); *F28F 2260/02* (2013.01); *Y02T 10/16* (2013.01)

(58) Field of Classification Search
CPC ....... H01L 35/30; F01N 5/025; F01N 3/043; F01N 2330/14; F01N 2510/06; F25B 21/02; F28F 2255/18; F28F 2260/02; F28F 7/02
USPC ........................................................ 136/205
See application file for complete search history.

(56) References Cited

U.S. PATENT DOCUMENTS 5,484,575 A * 1/1996 Steenackers ................... 422/176
2003/0223919 A1* 12/2003 Kwak ................. B01D 53/9445
422/174
(Continued)

FOREIGN PATENT DOCUMENTS

CN          2381023 Y      5/2000
CN        101459397 A      6/2009
(Continued)

OTHER PUBLICATIONS

U.S. Appl. No. 13/292,777, filed Nov. 9, 2011, Grossschmidt, et al.
(Continued)

*Primary Examiner* — Jayne Mershon
(74) *Attorney, Agent, or Firm* — Oblon, McClelland, Maier & Neustadt, L.L.P.

(57) ABSTRACT

A thermoelectric generator includes a thermoelectric module and a micro heat exchanger. The thermoelectric module includes p- and n-conducting thermoelectric material pieces which are alternately connected to one another via electrically conductive contacts. The thermoelectric module is thermally conductively connected to a micro heat exchanger. The micro heat exchanger includes a plurality of continuous channels having a diameter of at most 1 mm, through which a fluid heat exchanger medium can flow.

12 Claims, 3 Drawing Sheets

(51) Int. Cl.
  *F01N 13/16* (2010.01)
  *F28F 7/02* (2006.01)

(56) References Cited

U.S. PATENT DOCUMENTS

| | | | |
|---|---|---|---|
| 2004/0031514 A1* | 2/2004 | Bell | B60H 1/2215 |
| | | | 136/203 |
| 2005/0217714 A1* | 10/2005 | Nishijima | F01N 5/025 |
| | | | 136/204 |
| 2006/0225773 A1* | 10/2006 | Venkatasubramanian et al. | 136/205 |
| 2010/0186399 A1* | 7/2010 | Huttinger | 60/320 |
| 2010/0212712 A1* | 8/2010 | Tran | 136/205 |
| 2011/0016888 A1 | 1/2011 | Haa et al. | |
| 2011/0030939 A1 | 2/2011 | Carroll et al. | |
| 2011/0120106 A1 | 5/2011 | Bruck et al. | |
| 2011/0209740 A1 | 9/2011 | Bell et al. | |

FOREIGN PATENT DOCUMENTS

| | | |
|---|---|---|
| JP | 1999(H11)-122960 A1 | 10/1997 |
| JP | 2000-286469 A1 | 3/1999 |
| JP | 2004-140202 A | 10/2002 |
| JP | 2008-111653 A1 | 10/2007 |
| JP | 2007-329349 | 12/2007 |
| JP | 2009-150294 A | 12/2007 |
| WO | WO 2008/013946 A2 | 1/2008 |
| WO | WO 2009/138412 | 11/2009 |

OTHER PUBLICATIONS

U.S. Appl. No. 13/292,691, filed Nov. 9, 2011, Russ, et al.
U.S. Appl. No. 13/259,882, filed Sep. 23, 2011, Seeler, et al.
International Search Report and Written Opinion issued Feb. 2, 2012 in patent application No. PCT/IB2011/054295 filed Sep. 29, 2011.

* cited by examiner

THERMOELECTRIC MODULES FOR AN EXHAUST SYSTEM

The invention relates to thermoelectric modules which are suitable for fitting in the exhaust system of an internal combustion engine.

Thermoelectric generators and Peltier arrangements per se have been known for a long time. p- and n-doped semiconductors, which are heated on one side and cooled on the other side, transport electric charges through an external circuit, so that electrical work can be performed on a load in the circuit. The efficiency thereby achieved for the conversion of heat into electrical energy is thermodynamically limited by the Carnot efficiency. Thus, with a temperature of 1000 K on the hot side and 400 K on the "cold" side, an efficiency of $(1000-400) \div 1000 = 60\%$ would be possible. To date, however, only efficiencies up to 6% have been achieved.

If on the other hand a direct current is applied to such an arrangement, then heat is transported from one side to the other side. Such a Peltier arrangement works as a heat pump and is therefore suitable for cooling equipment parts, vehicles or buildings. Heating by means of the Peltier principal is also more favorable than conventional heating, because more heat is always transported than corresponds to the energy equivalent supplied.

At present, thermoelectric generators are used in space probes for the generation of direct currents, for the cathodic corrosion protection of pipelines, for the energy supply of light and radio buoys, and for the operation of radios and televisions. The advantages of thermoelectric generators reside in their extreme reliability. They operate irrespective of atmospheric conditions such as relative humidity; no material transport susceptible to interference takes place, rather only charge transport.

A thermoelectric module consists of p- and n-type pieces which are connected electrically in series and thermally in parallel. FIG. 2 shows such a module.

The conventional structure consists of two ceramic plates, between which the individual pieces are fitted alternately. Two pieces are in each case contacted electrically conductively via the end faces.

Besides the electrically conductive contacting, various further layers are normally also provided on the actual material, which serve as protective layers or as solder layers. Lastly, however, the electrical contact between two pieces is established via a metal bridge.

An essential element of thermoelectric components is the contacting. The contacting establishes the physical connection between the material in the "heart" of the component (which is responsible for the desired thermoelectric effect of the component) and the "outside world". The structure of such a contact is schematically represented in FIG. 1.

The thermoelectric material 1 inside the component provides the actual effect of the component. It is a thermoelectric piece. An electric current and a heat flux flow through the material 1, in order for it to fulfill its function in the overall structure.

The material 1 is connected on at least two sides via the contacts 4 and 5 to the leads 6 and 7, respectively. The layers 2 and 3 are in this case intended to symbolize one or more optionally required intermediate layers (barrier material, solder, bonding agent etc.) between the material and the contacts 4 and 5. The segments 2/3, 4/5, 6/7 respectively associated with one another pairwise may be identical, although they do not have to be. This will in the end depend likewise on the specific structure and the application, as well as the flow direction of electric current or heat flux through the structure.

The contacts 4 and 5 now have an important role. They ensure a tight connection between material and leads. If the contacts are poor, then high losses occur here and can greatly restrict the performance of the component. For this reason, the pieces and contacts are often pressed onto the material for use. The contacts are thus exposed to a strong mechanical load. This mechanical load increases further whenever elevated (or reduced) temperatures and/or thermal cycling are involved. The thermal expansion of the materials built into the component inevitably leads to mechanical stresses, which in the extreme case lead to failure of the component by fracture of the contact.

In order to prevent this, the contacts used must have a certain flexibility and resilient properties, so that such thermal stresses can be compensated for.

In order to impart stability to the entire structure, and ensure the required maximally homogeneous thermal coupling over every one of the pieces, carrier plates are necessary. To this end a ceramic is conventionally used, for example made of oxides or nitrides such as $Al_2O_3$, $SiO_2$ or AlN.

The conventional structure is often subject to limitations in respect of an application, since in each case only planar surfaces can be brought in contact with the thermoelectric module. A tight connection between the module surface and the heat source/heat sink is indispensable in order to ensure a sufficient heat flux.

Nonplanar surfaces, for example a round waste heat pipe, are not suitable for direct contact with the conventional module or they require a corresponding straight heat exchanger structure, in order to provide a transition from the nonplanar surface to the planar module.

Currently, attempts are being made to provide thermoelectric modules in motor vehicles such as automobiles and trucks, in the exhaust system or the exhaust gas recirculation, in order to obtain electrical energy from a part of the exhaust gas heat. In this case, the hot side of the thermoelectric element is connected to the exhaust gas or tailpipe, while the cold side is connected to a cooler. The amount of electricity which can be generated depends on the temperature of the exhaust gas and the heat flux from the exhaust gas to the thermoelectric material. In order to maximize the heat flux, devices are often built into the tailpipe. These are subject to limitations, however, since for example the installation of a heat exchanger often leads to a pressure loss in the exhaust gas, which in turn leads to an intolerable increased consumption of the internal combustion engine.

Conventionally, the thermoelectric generator is installed for use behind the exhaust gas catalytic converter in the exhaust system. Together with the pressure loss of the exhaust gas catalytic converter, this often leads to excessive pressure losses so that thermally conductive devices cannot be provided in the exhaust system; rather, the thermoelectric module bears on the outside of the tailpipe. To this end, the tailpipe must often be configured with a polygonal cross section so that planar external surfaces can come in tight contact with the thermoelectric material.

Neither the heat transfer, nor pressure losses which occur, have to date been satisfactory.

It is an object of the present invention to provide a thermoelectric module for installation in the exhaust system of an internal combustion engine, which avoids the disadvantages of the known modules and ensures better heat transfer with a low pressure loss.

The object is achieved according to the invention by a thermoelectric module consisting of p- and n-conducting thermoelectric material pieces which are alternately connected to one another via electrically conductive contacts, wherein the thermoelectric module is thermally conductively connected to a micro heat exchanger which comprises a plurality of continuous channels having a diameter of at most 1 mm, through which a fluid heat exchanger medium can flow.

It is particularly advantageous for the channels of the micro heat exchanger to be coated with a washcoat of an internal combustion engine exhaust gas catalyst, in particular a motor vehicle exhaust gas catalyst. In this way, a separate exhaust gas catalytic converter can be obviated and the pressure loss in the exhaust system is minimized. The integrated design simplifies the overall structure and facilitates installation in the exhaust system.

By using micro heat exchangers, it is possible to ensure an improved heat flux from the exhaust gas to the thermoelectric module, with at the same time a sufficiently low pressure loss. According to the invention, the exhaust gas flows through the microchannels of the micro heat exchanger. The channels are in this case preferably coated with an exhaust gas catalyst, which in particular catalyzes one or more of the conversions: $NO_x$ to nitrogen, hydrocarbons to $CO_2$ and $H_2O$, and CO to $CO_2$. Particularly preferably, all these conversions are catalyzed.

Suitable catalytically active materials such as Pt, Ru, Ce, Pd are known, and are described for example in Stone, R. et al., Automotive Engineering Fundamentals, Society of Automotive Engineers 2004. These catalytically active materials are applied in a suitable way onto the channels of the micro heat exchanger. Preferably, application in the form of a washcoat may be envisaged. In this case, the catalyst is applied in the form of a suspension as a thin layer onto the inner walls of the micro heat exchanger, or onto its channels. The catalyst may then consist of a single layer or various layers with identical or varying composition. The applied catalyst may then fully or partially replace the normally used exhaust gas catalytic converter of the internal combustion engine during use in a motor vehicle, depending on the dimensioning of the micro heat exchanger and its coating.

According to the invention, the term "micro heat exchanger" is intended to mean heat exchangers which have a plurality of continuous channels with a diameter of at most 1 mm, particularly preferably at most 0.8 mm. The minimum diameter is set only by technical feasibility, and is preferably of the order of 50 μm, particularly preferably 100 μm.

The channels may have any suitable cross section, for example round, oval, polygonal such as square, triangular or star-shaped, etc. Here, the shortest distance between opposite edges or points of the channel is considered as the diameter. The channels may also be formed so as to be flat, in which case the diameter is defined as the distance between the bounding surfaces. This is the case in particular for heat exchangers which are constructed from plates or layers. During operation, a heat exchanger medium flows through the continuous channels while transferring heat to the heat exchanger. The heat exchanger is on the other hand thermally connected to the thermoelectric module, so that good heat transfer is obtained from the heat exchanger to the thermoelectric module.

The micro heat exchanger may be constructed in any suitable way from any suitable materials. It may for example be made from a block of a thermally conductive material, into which the continuous channels are introduced.

Any suitable materials may be used as the material, such as plastics, for example polycarbonate, liquid crystal polymers such as Zenith® from DuPont, polyether ether ketones (PEEK), etc. Metals may also be used, such as iron, copper, aluminum or suitable alloys such as chromium-iron, Fecralloy. Ceramics or inorganic oxide materials may furthermore be used, such as aluminum oxide or zirconium oxide or cordierite. It may also be a composite material made of a plurality of the aforementioned materials. The micro heat exchanger is preferably made of a high temperature-resistant alloy (1000-1200° C.), Fecralloy, iron alloys containing Al, stainless steel, cordierite. The microchannels may be introduced into a block of a thermally conductive material in any suitable way for example by laser methods, etching, boring, etc.

As an alternative, the micro heat exchanger may also be constructed from different plates, layers or tubes, which are subsequently connected to one another, for example by adhesive bonding or welding. The plates, layers or tubes may in this case be provided in advance with the microchannels and then assembled.

It is particularly preferred to produce the micro heat exchanger from a powder by means of a sintering method. Both metal powders and ceramic powders can be used as the powder. Mixtures composed of metal and ceramic, composed of different metals or composed of different ceramics are also possible. Suitable metal powders comprise, for example, powders composed of ferritic steels, Fecralloy or stainless steel. The production of the micro heat exchanger by means of a sintering method makes it possible to manufacture any desired structure.

The use of a metal as material for the micro heat exchanger affords the advantage of a good thermal conductivity. By contrast, ceramics have a good heat storage capability, and so they can be utilized, in particular, to compensate for temperature fluctuations.

If plastics are used as material for the micro heat exchanger, it is necessary to apply a coating that protects the plastic from the temperatures of the exhaust gas flowing through the micro heat exchanger. Such coatings are also referred to as "thermal barrier coating". On account of the high temperatures of the exhaust gas, it is necessary to coat all surfaces of the micro heat exchanger composed of the plastics material.

The external dimensions of the micro heat exchanger used according to the invention are preferably from 60×60×20 to 40×40×8 $mm^3$.

The specific heat transfer area of the micro heat exchanger, in relation to the volume of the micro heat exchanger, is preferably from 0.1 to 5 $m^2/l$, particularly preferably from 0.3 to 3 $m^2/l$, in particular from 0.5 to 2 $m^2/l$.

Suitable micro heat exchangers are commercially available, for example from the Institut für Mikrotechnik Mainz GmbH. The IMM offers various geometries of microstructured heat exchangers, and in particular microstructured high-temperature heat exchangers for a maximum operating temperature of 900° C. These high-temperature heat exchangers have dimensions of about 80×50×70 $mm^3$ and function (for other applications) according to the counter-flow principle. They have a pressure loss of less than 50 mbar and a specific heat transfer area of about 1 $m^2/l$.

Other micro heat exchangers are exhibited by VDI/VDE-Technologiezentrum Informationstechnik GmbH (www.nanowelten.de). Micro heat exchangers are furthermore offered by Ehrfeld Mikrotechnik BTS GmbH, Wendelsheim and SWEP Market Services, a branch of Dover Market Services GmbH, Fürth.

The micro heat exchanger is configured so that it can be connected to the thermoelectric module in a way which has the best possible thermal conduction. Depending on the structure and material constitution, it may be thermally conductively connected directly to the thermoelectric module. It is also possible for the thermoelectric module to be flat and, on the thermoelectric material pieces, to have a carrier plate on the hot side which is thermally conductively connected to the micro heat exchanger. Suitable materials for carrier plates are mentioned in the introduction.

It is preferred to form the micro heat exchanger integrally with the thermoelectric module. For this purpose, it is possible, for example, to sinter the micro heat exchanger directly onto the thermoelectric module. This has the advantage that a highly thermally conductive connection is obtained independently of the form of the surface of the thermoelectric module.

The pressure loss generated through the continuous channels of the heat exchanger for a gas flowing through is preferably at most 100 mbar, in particular at most 50 mbar. Such pressure losses do not lead to an increased fuel consumption of the internal combustion engine. Such a pressure loss can be realized, in particular if the micro heat exchangers are arranged such that the channels through which the exhaust gas flows run parallel and are connected to an inlet on one side and to an outlet on the other side. The length of the channels through which the exhaust gas flows is in this case preferably at most 60 mm, in particular at most 40 mm. If more than one micro heat exchanger is used, the micro heat exchangers are likewise connected in parallel and connected to a common inlet and a common outlet, such that the channels of the individual heat exchangers likewise run parallel.

The heat-exchanging surface of the micro heat exchanger may be installed directly in the exhaust system or tailpipe of an internal combustion engine, in particular of a motor vehicle. It may in this case be installed fixed or removably. The heat-exchanging surface may also be firmly encapsulated with the thermoelectric module.

If the micro heat exchanger is provided with a washcoat of the catalyst material, it may be installed in the exhaust system at the position of the original exhaust gas catalytic converter. In this way, a high exhaust gas temperature can be supplied to the micro heat exchanger. The temperature may be increased even further by the chemical conversion at the exhaust gas catalyst of the micro heat exchanger, so that much more efficient heat transfer takes place than in known systems.

An improved efficiency of the thermoelectric module is also achieved by the improved heat flux.

A protective layer for protecting against excessive temperatures may furthermore be provided between the thermoelectric module and the micro heat exchanger. This layer, also referred to as a phase-change layer, is preferably made of inorganic metal salts or metal alloys having a melting point in the range of from 250° C. to 1700° C. Suitable metal salts are for example fluorides, chlorides, bromides, iodides, sulfates, nitrates, carbonates, chromates, molybdates, vanadates and tungstates of lithium, sodium, potassium, rubidium, cesium, magnesium, calcium, strontium and barium. Mixtures of suitable salts of this type, which form double or triple eutectics, are preferably used. They may also form quadruple or quintuple eutectics.

Alternatively, it is possible to use metal alloys as phase-change materials and combinations thereof, which form double, triple, quadruple or quintuple eutectics, starting from metals such as zinc, magnesium, aluminum, copper, calcium, silicon, phosphorus and antimony. The melting points of the metal alloys should in this case lie in the range of from 200° C. to 1800° C.

The thermoelectric module may be encapsulated with the protective layer, in particular when using metals such as nickel, zirconium, titanium, silver and iron, or when using alloys based on nickel, chromium, iron, zirconium and/or titanium.

One or more of the thermoelectric modules, for example connected in succession, may be integrated into the exhaust system of the internal combustion engine. In this case, thermoelectric modules comprising different thermoelectric materials may also be combined. In general, it is possible to use all suitable thermoelectric materials which are suitable for the temperature range of an exhaust gas of an internal combustion engine. Examples of suitable thermoelectric materials are skutterudites, for example $CoSb_3$, $RuPdSb_6$, $TX_6$ with T=Co, Rh, Ir and X=P, As, Sb; $X_2Y_8Z_{24}$ with X=lanthanides, actinides, alkaline earth metals, alkali metals, Th, group IV elements; half-Heusler compounds such as TiNiSn, HfPdSn and intermetallic alloys; clathrates such as $Zn_4Sb_3$, $Sr_6Ga_{16}Ge_{30}$, $Cs_8Sn_{44}$, $CO_4TeSb_4$; oxides such as $Na_xCoO_2$, $CaCo_4O_9$, $Bi_2Sr_2Co_2O_y$, $Sr_2TiO_4$, $Sr_3Ti_2O_7$, $Sr_4Ti_3O_{10}$, $R_{1-x}M_xCoO_3$ with R=rare earth metal and M=alkaline earth metal; $Sr_{n+1}Ti_nO_{3n+1}$, where n is an integer; $YBa_2Cu_3O_{7-x}$; silicides such as $FeSi_2$, $Mg_2Si$, $Mn_{15}Si_{26}$; borides such as $B_4C$, $CaB_6$; $Bi_2Ce_3$ and derivatives thereof, PbCe and derivatives thereof, antimonides such as zinc antimonide, Zintl phases such as $Yb_{14}MnSb_4$.

The invention also relates to the use of a thermoelectric module as described above in the exhaust system of an internal combustion engine, preferably in a motor vehicle such as an automobile or truck. In this case, the thermoelectric module is used in particular for generating electricity from the heat of the exhaust gas.

When there is a washcoat on the micro heat exchanger, however, the thermoelectric module may also be used in reverse for preheating the exhaust gas catalyst during a cold start of an internal combustion engine, preferably of a motor vehicle. In this case, the thermoelectric module is used as a Peltier element. When a voltage difference is applied to the module, the module transports heat from the cold side to the hot side. The preheating of the exhaust gas catalyst due to this reduces the cold start time of the catalyst.

The invention furthermore relates to an exhaust system of an internal combustion engine, preferably of a motor vehicle, comprising one or more thermoelectric modules as described above, integrated into the exhaust system In this case, the exhaust system is intended to mean the system which is connected to the outlet of an internal combustion engine and in which the exhaust gas is processed.

The thermoelectric module according to the invention has many advantages. The pressure loss in the exhaust system of an internal combustion engine is low, in particular when the micro heat exchanger is coated with a washcoat of the exhaust gas catalyst. The structure of the exhaust system can be simplified significantly by the one integrated component. Since the integrated component can be integrated closer to the internal combustion engine in the exhaust system, higher exhaust gas temperatures can be supplied to the thermoelectric module. By the reverse use of the thermoelectric module as a Peltier element, the exhaust gas catalyst can be heated during a cold start of the engine.

Exemplary embodiments of the invention are illustrated in the figures and are explained in greater detail in the following description.

In the figures:

FIG. 3 illustrates a construction of a thermoelectric generator such as can be inserted into the exhaust system of a motor vehicle, for example.

Figure 1:
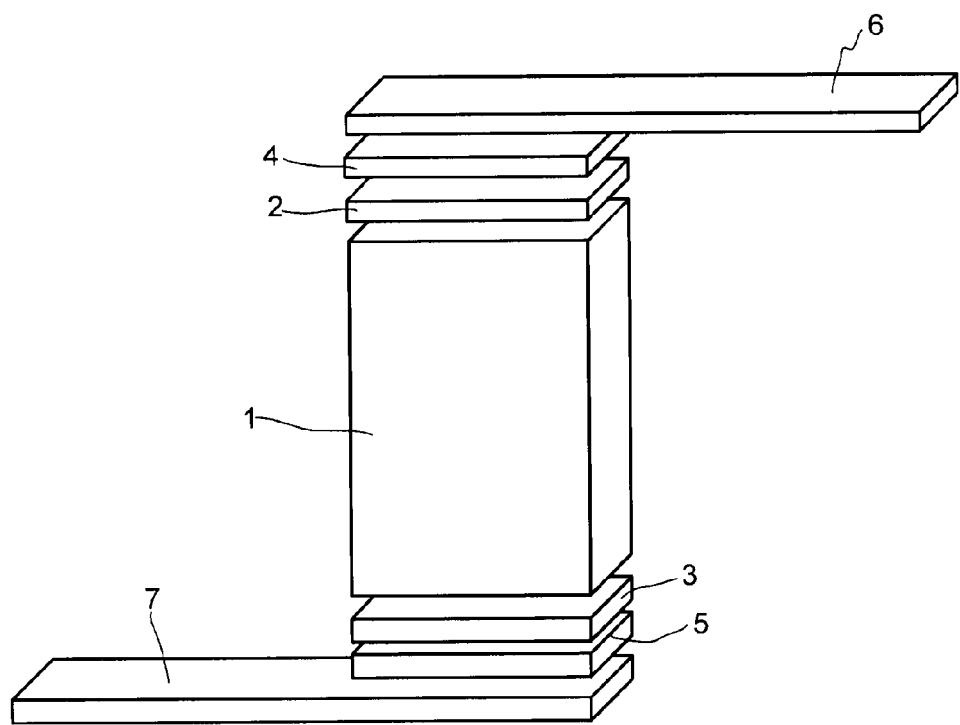
FIG. 1 shows a perspective view of the contacting of thermoelectric components.
Figure 2:
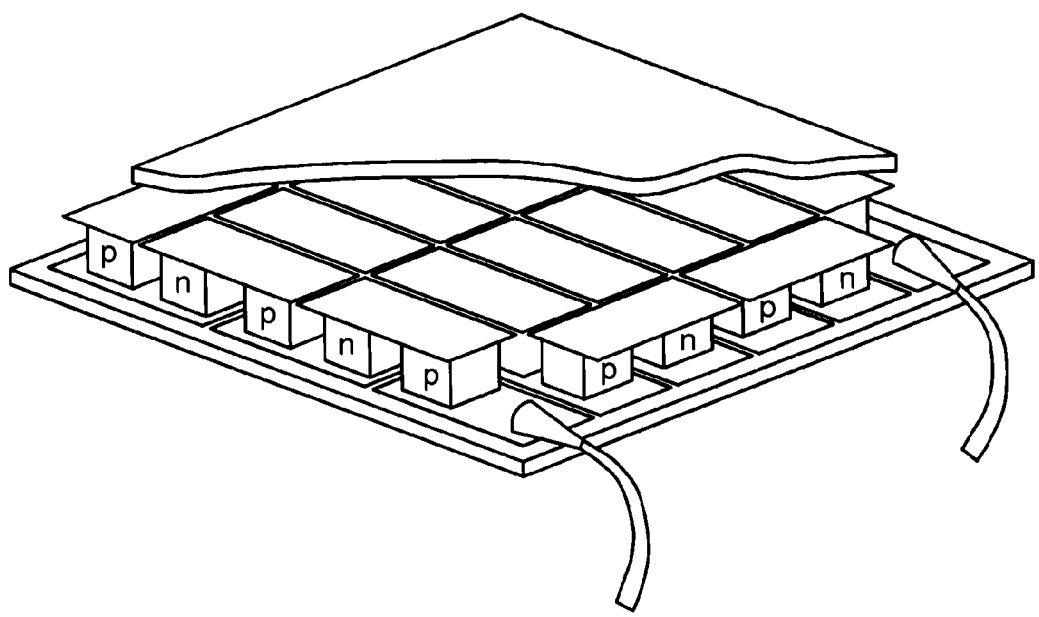
FIG. 2 shows a perspective view of a thermoelectric module.

An exhaust pipe 10, through which exhaust gases are led away from an internal combustion engine, leads to a manifold 11. The manifold 11 has a cross-sectional area that decreases in the flow direction of the exhaust gas. The manifold 11 is adjoined by micro heat exchangers 13. The latter are connected to the manifold 11 in such a way that the exhaust gas flows through channels in the micro heat exchangers 13. The channels in the micro heat exchangers lead to a collector 15, via which the exhaust gas, after the latter has flowed through the channels in the micro heat exchangers, is conducted into a further exhaust pipe 17, which usually ends in an exhaust of the internal combustion engine.

The micro heat exchangers 13 are each connected on one side to a thermoelectric module 19. The thermoelectric module 19 is cooled on the opposite side to the micro heat exchanger. For this purpose, use is preferably made of a cooling liquid, for example cooling water, which flows over the thermoelectric module 19. In this case, it is firstly possible to conduct the cooling liquid through channels in a heat exchanger, for example a micro heat exchanger. It is preferred, however, to provide a cooling channel 21, through which the cooling liquid flows, on that side of the thermoelectric module 19 which is to be cooled, wherein a wall of the cooling channel 21 is formed by the thermoelectric module 19.

In one preferred embodiment, micro heat exchangers 13, thermoelectric modules 19 and cooling channels 21 are stacked, wherein the micro heat exchangers 13 situated in the inner portion are in each case connected at their opposite sides to a thermoelectric module 19 and, accordingly, the cooling channels 21 situated in the inner portion are also connected in each case at their opposite sides to a thermoelectric module 19. A corresponding layer construction is illustrated by way of example in FIG. 4. Here the layer construction is bounded by a cooling channel in each case at the top side and at the underside. The cooling channel 21 is adjoined by a thermoelectric module 19, which is connected on the opposite side to a micro heat exchanger 13. The micro heat exchanger 13 is followed by a further thermoelectric module 19 and a further cooling channel 21.

The layer construction makes it possible to utilize the heat of the exhaust gas as well as possible and to use a large number of thermoelectric modules 19 in a small space.

Figure 3:
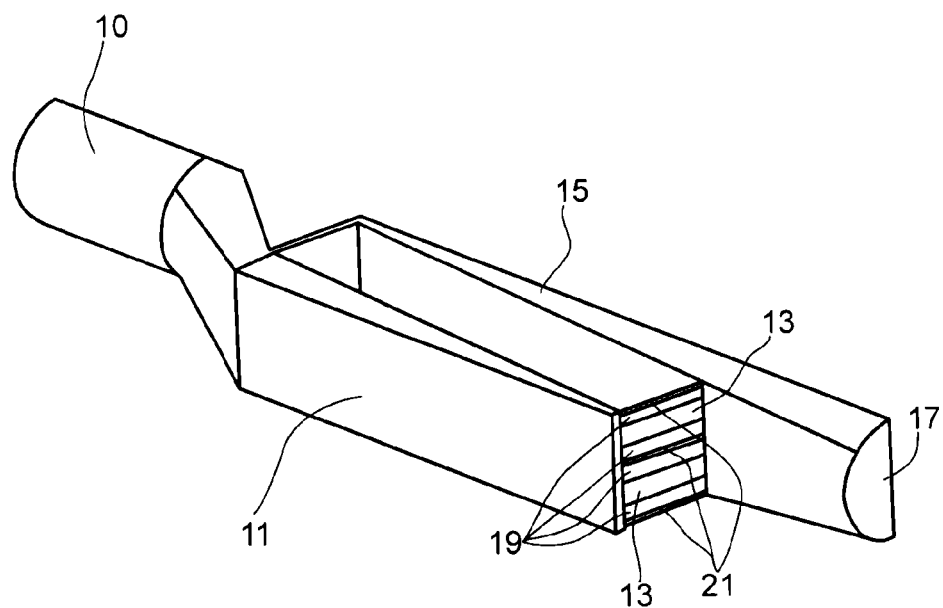
FIG. 3 shows a three-dimensional illustration of a construction of a thermoelectric generator.
Figure 4:
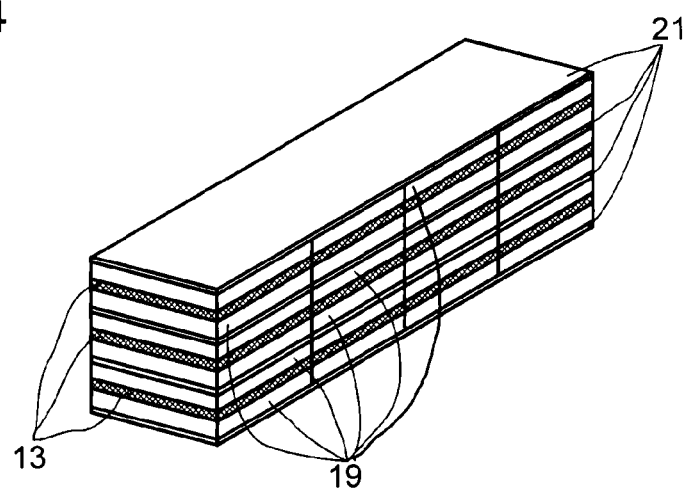
FIG. 4 shows a three-dimensional illustration of a layer construction of a thermoelectric generator.

Besides the embodiment illustrated in FIGS. 3 and 4 with a layer construction wherein the individual layers run parallel to the main flow axis of the exhaust pipe 10, it is also possible to design the layer construction such that the individual layers run perpendicularly to the main flow axis of the exhaust pipe 10. Independently of the orientation of the individual layers, however, the channels in the micro heat exchangers 13 preferably always run transversely with respect to the main flow direction of the exhaust pipe 10 from the manifold 11 to the collector 15.

In the case of an orientation of the layers as illustrated in FIGS. 3 and 4, the individual layers can comprise in each case one micro heat exchanger 13 and one thermoelectric module 19 or alternatively a plurality of micro heat exchangers 13 and/or a plurality of thermoelectric modules 19, which are respectively positioned alongside one another. If a plurality of micro heat exchangers 13 and a plurality of thermoelectric modules 19 are used, then they can have contact areas having the same size or different sizes. Preferably, the contact areas have the same size, such that one micro heat exchanger 13 in each case is connected to one thermoelectric module 19. In this embodiment, it is then possible to form a plurality of stacks which are subsequently connected to one another in series, wherein the individual stacks are preferably oriented such that the respective cooling channels 21 adjoin one another with their inlets and outlets, thus forming cooling channels that are continuous over the series of the stacks. In this case, the orientation of the cooling channels is chosen such that the cooling liquid and the exhaust gas are guided in cross-flow relative to one another. Alternatively, it is also possible, of course, to orient the cooling channels in any other direction desired. Thus, the cooling channels can, for example, also run parallel to the channels in the micro heat exchangers.

The invention claimed is:

1. An exhaust system of an internal combustion engine, comprising:
one or more thermoelectric generators, integrated into the exhaust system, each comprising:
a thermoelectric module comprising p- and n-conducting thermoelectric material pieces which are alternately connected to one another via electrically conductive contacts,
a second thermoelectric module, and
a cooling channel formed by a side of the thermoelectric module and a side of the second thermoelectric module to conduct cooling fluid to the thermoelectric module and the second thermoelectric module,
wherein the thermoelectric module is thermally conductively connected to a micro heat exchanger which comprises a plurality of continuous channels having a diameter of at most 1 mm, through which exhaust gas flows,
wherein the thermoelectric module is flat and, on the thermoelectric material pieces connected to one another, has a carrier plate on a hot side which is thermally conductively connected to the micro heat exchanger,
wherein the thermoelectric module and the micro heat exchanger are arranged in layers that are parallel to a main flow of the exhaust gas, and
wherein the cooling channel is parallel to the channels of the micro heat exchanger;
a manifold connected to the thermoelectric generators to lead the exhaust gas from the internal combustion engine to the thermoelectric generators; and
a collector positioned downstream of the thermoelectric generators to lead the exhaust gas away from the thermoelectric generators.

2. The exhaust system according to claim 1, wherein the micro heat exchanger is formed integrally with the thermoelectric module.

3. The exhaust system according to claim 1, wherein a protective layer for protecting against excessive temperatures is provided between the thermoelectric module and the micro heat exchanger.

4. The exhaust system according to claim 3, wherein the protective layer is made of inorganic metal salts or metal alloys having a melting point in the range of from 250° C. to 1700° C.

5. The exhaust system according to claim 1, wherein the channels of the micro heat exchanger are coated with a washcoat of an motor vehicle exhaust gas catalyst.

6. The exhaust system according to claim 5, wherein the catalyst catalyzes at least one of the conversions: $NO_x$ to nitrogen, hydrocarbons to $CO_2$ and $H_2O$, and CO to $CO_2$.

7. The exhaust system according to claim 1, wherein the pressure loss generated through the continuous channels of the micro heat exchanger for a gas flowing through is at most 100 mbar.

8. The exhaust system according to claim 1, wherein of the micro heat exchanger is made from a block of a thermally conductive material, into which the continuous channels are introduced.

9. The exhaust system according to claim 1, wherein the specific heat transfer area, in relation to the volume of the micro heat exchanger, is from 0.1 to 5 $m^2/l$.

10. The exhaust system according to claim 1, wherein the carrier plate is made of a material suitable to ensure thermal conductivity between the micro heat exchanger and the thermoelectric module.

11. The exhaust system according to claim 1, wherein the carrier plate is made of $Al_2O_3$, $SiO_2$ or AlN to ensure thermal conductivity between the micro heat exchanger and the thermoelectric module.

12. An exhaust system of an internal combustion engine, comprising:
- one or more thermoelectric generators integrated into the exhaust system, each of the generators comprising a thermoelectric module comprising p- and n-conducting thermoelectric material pieces which are alternately connected to one another via electrically conductive contacts, wherein the thermoelectric module is thermally conductively connected to a micro heat exchanger which comprises a plurality of continuous channels having a diameter of at most 1 mm, through which exhaust gas flows;
- a manifold connected to the thermoelectric generators to lead the exhaust gas from the internal combustion engine to the thermoelectric generators; and
- a collector positioned downstream of the thermoelectric generators to lead the exhaust gas away from the thermoelectric generators,
- wherein the thermoelectric module and the micro heat exchanger are arranged in layers that are parallel to a main flow of the exhaust gas,
- wherein the exhaust system further comprises a second thermoelectric module and a cooling channel formed by a side of the first thermoelectric module and a side of the second thermoelectric module to conduct cooling fluid to the thermoelectric module and the second thermoelectric module, and
- wherein the cooling channel is parallel to the channels of the micro heat exchanger.

* * * * *